United States Patent
Leizerovich

(10) Patent No.: US 6,353,359 B1
(45) Date of Patent: Mar. 5, 2002

(54) TRAINING SCHEME FOR HIGH EFFICIENCY AMPLIFIER

(75) Inventor: Gustavo V. Leizerovich, Aventura, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/705,689

(22) Filed: Nov. 6, 2000

(51) Int. Cl.[7] ............ G01R 19/00; H04B 1/04
(52) U.S. Cl. ............ 330/2; 330/129; 330/284; 455/126
(58) Field of Search ............ 330/2, 10, 129, 330/136, 284; 455/126, 127

(56) References Cited

U.S. PATENT DOCUMENTS

| | | | | |
|---|---|---|---|---|
| 5,420,536 A | * | 5/1995 | Faulkner et al. | 330/129 |
| 5,524,285 A | * | 6/1996 | Wray et al. | 455/126 |
| 5,564,087 A | * | 10/1996 | Cygan et al. | 455/126 |
| 5,675,287 A | * | 10/1997 | Baker et al. | 330/129 |
| 5,920,808 A | * | 7/1999 | Jones et al. | 455/126 |
| 6,043,707 A | * | 3/2000 | Budnik | 330/10 |
| 6,252,456 B1 | * | 6/2001 | Baker et al. | 330/129 |

* cited by examiner

Primary Examiner—Robert Pascal
Assistant Examiner—Khanh Van Nguyen
(74) Attorney, Agent, or Firm—Scott M. Garrett

(57) ABSTRACT

A system and method for employing a training scheme to a linear amplifier system having a modulator component for modulation of a supply power of an RF power amplifier. A supply modulator is set at a maximum or peak supply voltage of the RF power amplifier that corresponds to a maximum saturation point of the RF power amplifier. A training mode is entered wherein an input signal is provided and a phase adjustment and an attenuation level for the input signal to the RF power amplifier is determined. The phase adjustment and attenuation level is employed in normal operation. A relationship between the maximum clip level and maximum supply voltage and the instantaneous voltage level of the supply that will be utilized to modulate the reference signal is employed to determine the attenuation level.

10 Claims, 2 Drawing Sheets and

TRAINING SCHEME FOR HIGH EFFICIENCY AMPLIFIER

TECHNICAL FIELD

The present invention generally relates to communication systems, and in particular to a system and method for training a power amplifier residing in a linear transmitter that employs supply modulation for facilitating efficient operation of the linear transmitter.

BACKGROUND

Increasing demand for mobile and personal communications services has renewed interest in spectrally efficient modulation schemes. However, due to growing pressures for extra capacity, the advantages of retaining a constant envelope are giving way to linear modulation. Although filtering applied in linear modulation schemes generally produces gains in spectrum utilization, envelope variations are also introduced. Additionally, the inefficiency of conventional linear RF amplifiers has a deleterious effect on battery life of portable wireless transmitting equipment. Improvements in RF amplifier efficiency would directly lead to improvements in the talk-time recharging intervals and size and weight of the overall wireless unit. The ideal amplifier for linear modulated portable systems is therefore a linear amplifier which is also power efficient.

Linear transmitters are well known. To achieve both linearity and efficiency in such devices, linearization techniques can be employed in a power amplifier such as a Cartesian feedback loop. A Cartesian feedback loop is a closed loop negative feedback technique which sums the baseband feedback signal to quadrature component signals (e.g., in-phase (I) and quadrature (Q) signals) prior to amplifying and up-converting to an output frequency and a power level. Cartesian feedback of the baseband quadrature modulation provides excellent reduction in intermodulation distortion with low complexity and cost.

High level modulation of the power supply of an RF power amplifier, for the purpose of amplitude (or envelope) modulation is a known technique which provides good power efficiency when combined with efficient high level power supply modulators. A problem with these systems is the relatively larger bandwidths of the amplitude signals compared with corresponding baseband quadrature modulation and the inability to control AM-PM distortion. Consequently, the spectral control is generally inferior to that of Cartesian Feedback, IF Feedback and RF Feedback. Full Polar Feedback overcomes the distortion problem but still suffers from the bandwidth expansion problem. Additional problems occur when power supply modulation is run too close to the saturation point of the power amplifier because inaccuracies in component gain due to manufacturing tolerances and variations in temperature, power amplifier loading and supply voltage may allow one amplifier to operate to specification, while another amplifier may saturate under the same conditions.

BRIEF DESCRIPTION OF THE DRAWINGS

The features of the present invention, which are believed to be novel, are set forth with particularly in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE INVENTION

Figure 1:
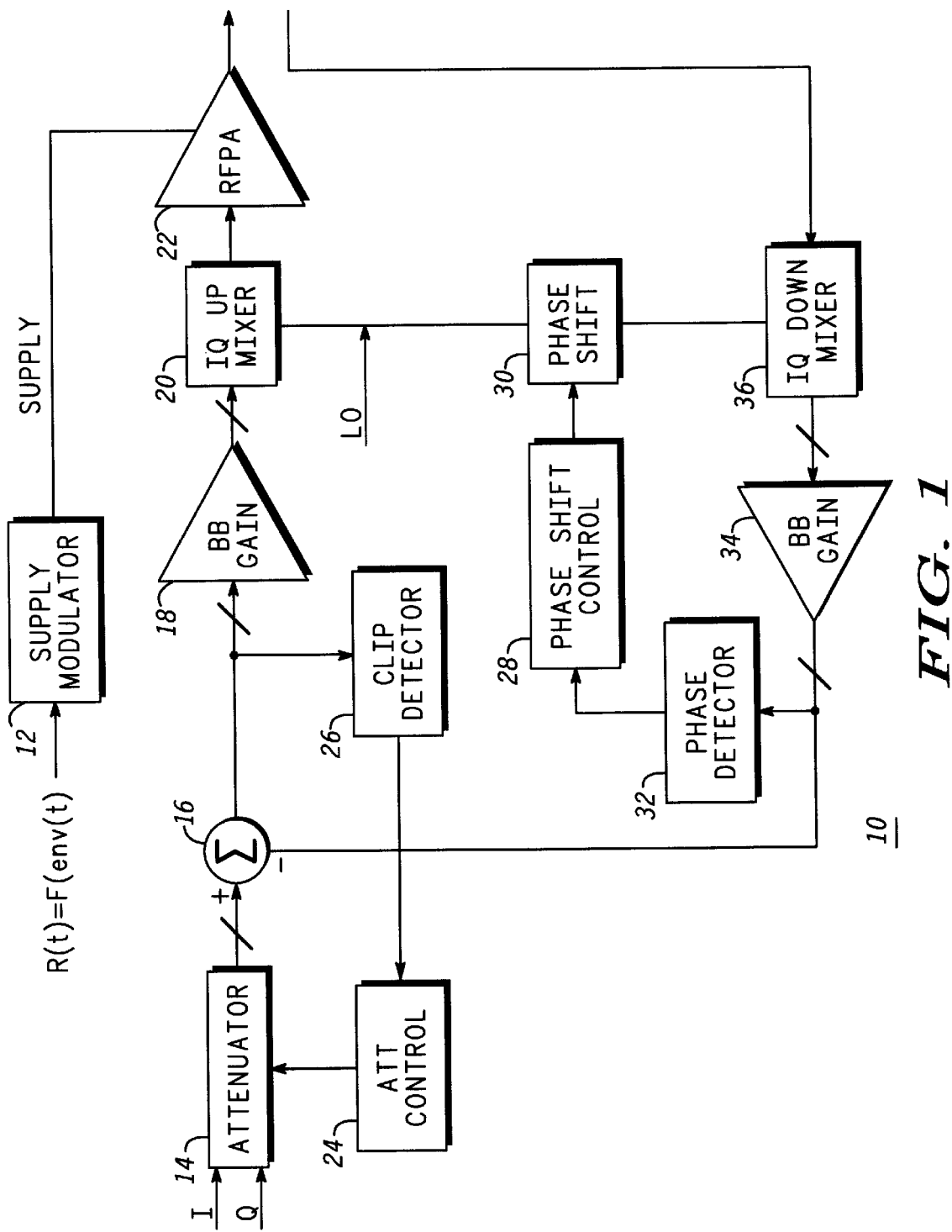
FIG. 1 is a functional schematic block representation of a transmitter system in accordance with the present invention.

While the specification concludes with claims defining the features of the invention that are regarded as novel, it is believed that the invention will be better understood from a consideration of the following description in conjunction with the drawing figures, in which like reference numerals are carried forward.

The present invention relates to a system and method for providing a highly efficient linear transmitter. The present system and method employs a training scheme to a linear amplifier system having a modulator component for modulation of a supply power of an RF power amplifier. A supply modulator is set at a maximum or peak supply voltage of the RF power amplifier that corresponds to a maximum saturation point of the RF power amplifier. A training mode is entered wherein an input signal is provided and a phase adjustment and an attenuation adjustment level for the RF power amplifier is determined. The phase adjustment and the attenuation adjustment is employed in normal operation. While the following description of one aspect of the present invention primarily relates to a mobile communications unit, it will be understood and appreciated by those skilled in the art that a system and/or method in accordance with the present invention also may be implemented in conjunction with other types of telecommunications units.

FIG. 1 illustrates a linear transmitter in accordance with one aspect of the present invention. A digital signal processor (not shown) may be employed to provide an input signal to a variable attenuator component 14. The input signal can be a complex digital baseband signal having quadrature components (e.g., in-phase and quadrature signal components). The attenuator component 14 provides an attenuated reference signal which is coupled to a summing junction 16. The summing junction 16 sums or combines the reference signal with a down mixer signal outputted from a first baseband amplifier 34 to provide an error signal as an input to a second baseband amplifier 18. The second baseband amplifier 18 provides gain to the error signal for input into an IQ up-mixer 20. The IQ up-mixer 20 translates the error signal to a required radio frequency (RF) for transmission as determined by a frequency of a local oscillator (LO). The signal is then provided as an input to a RF power amplifier 22, which in turn provides an RF output signal.

A negative feedback correction loop is provided to ensure linear operation of the transmitter 10. Although, the present example of FIG. 1 illustrates a Cartesian feedback loop, other feedback loops may be employed, such as IF feedback and RF feedback loops. It is to be appreciated that any feedback correction that can be facilitated by training may be employed to carry out the present invention. The negative feedback correction loop includes an IQ down-mixer 36 and the first baseband amplifier 34 coupled to the summing junction 16. A phase shift control component 28 is coupled to a phase detector 32 for setting a loop phase adjustment to a phase shift component 30. A clip detector 26 is coupled to an attenuator control component 24 employed to provide a maximum clip level value to the attenuator component 14 during training. Furthermore, the clip detector may be employed during normal operation to provide an interrupt to a DSP or the like in the event that the reference signal level exceeds a value that will cause the RF power amplifier 22 to saturate.

A modulator component 12 is provided for modulating an operating point of the RF power amplifier 22. The modulator component 12 provides modulation of a supply voltage of the RF power amplifier 22. The modulator component 12 receives an envelope signal R(t) representing a function of the envelope F(env(t)) of the RF input signal (I and Q). For example, the function of the envelope can be a constant K multiplied by the actual envelope signal to provide an input signal to the modulator 12. The modulator component 12 then employs the envelope signal R(t) to provide an optimal supply voltage to the RF power amplifier 22 for the desired RF output envelope level. The supply voltage and/or the base or gate voltage of the RF power amplifier 22 can be modulated by the modulator component 12 driven by a digital signal processor (DSP) or the like (not shown). The DSP or the like can thus operate to optimize the operation of the RF power amplifier at its most efficient point at a given required instantaneous output power. During normal operation of the linear transmitter 10, the supply modulator portion modulates the voltage supplied to the RF power amplifier to operate at maximum efficiency without exceeding the saturation point of the amplifier based on the input signal (I and Q). The difference between the saturation point and the operating point of the amplifier is known as the operating headroom of the amplifier. The smaller the operating headroom, the more efficient operation of the amplifier.

However, due to inaccuracies in components gains due to manufacturing tolerances and variations in temperature, power amplifier loading, and supply voltage, a saturation point of a given RF power amplifier from production unit to production unit may vary. In situations where the modulator component 12 is designed to allow operation of the RF power amplifier very near saturation to provide maximum efficiency (e.g., very small operating headroom), an input signal may exceed the saturation point of a RF power amplifier on some units and not other, resulting in loss of transmission for units that saturate.

In normal operating mode, it is not known if a given power amplifier unit is running below, at or above saturation. Therefore, by establishing a maximum clip point or level at the maximum supply voltage and using the relationship between the maximum clip point or level, the maximum supply voltage and an instantaneous supply voltage, proper attenuation of the reference signal may be employed during normal operation. The RF power amplifier 22 can be adjusted to continuously operate close to its saturation point without exceeding the saturation point, so that maximum efficiency is obtained.

Therefore, the present invention employs a training mode to provide phase adjustment of a feedback signal with respect to an input training signal and determination of a maximum clip level for the power amplifier. The phase shift component 30, under the control of the phase shift control component 28, is used to set the loop phase. The attenuation control component 24 controls the level of the modulated reference signals applied to the transmitter circuitry. Attenuation adjustments and phase shift adjustments are provided in conjunction with a training waveform. A detailed description of the training waveform methodology can be found in U.S. Pat. No. 5,066,923, issued to Gailus et al. on Nov. 19, 1991, for a Linear Transmitter Training Method And Apparatus, which is hereby incorporated by reference. Another training methodology is illustrated in U.S. Pat. No. 5,748,038, issued to Boscovic et al., for a Method for Amplifier Training in a Linear Power Amplifier, which is also hereby incorporated by reference. Therefore, the details of the training methodology will be omitted for the sake of brevity, except to facilitate the understanding of the present invention. The training waveform is normally transmitted at the beginning of a transmission, but may also be transmitted during transmission depending upon the communication protocol. The training waveform provides a test signal for circuitry which adjusts modulation levels and loop phase.

Proper attenuator adjustment avoids power amplifier clipping, which is responsible for adjacent channel interference (splatter). Proper loop phase adjustment is necessary to prevent loop instability. The relationship between the maximum clip level and the maximum supply voltage or power can be employed to ensure that the input signal does not exceed the saturation point of the RF power amplifier at a given supply level regardless of the operating variations in any given RF power amplifier. During the training mode, the function R(t) is set so that the modulation component provides the RF power amplifier 22 with a maximum operating supply or peak voltage that is to be utilized in normal operating mode, which is the supply voltage that the RF power amplifier will operate at maximum efficiency and will have a maximum saturation point.

Referring again to FIG. 1, in a training mode the modulator 12 sets the supply voltage of the RF power amplifier 22 to a maximum or peak value of the supply modulations necessary to determine a maximum saturation point of the RF power amplifier 22. Training is then performed for phase training. In an open loop training mode, the connection between the first baseband amplifier 34 and the summer 16 is disconnected. A phase difference of the quadrature input signals is then measured via the phase detector component and transmitted to the phase shift control component 28. The phase shift control component 28 communicates with the phase shift component 30 to provide a phase adjustment based on the phase difference measurement. By making this adjustment, proper loop phase relationship can be ensured, and the feedback process will operating in a negative manner as desired, and will not inadvertently oscillate due to unintended positive feedback.

The negative feedback loop is then closed for performing amplitude training. In an amplitude training mode, the maximum clip point of the RF power amplifier 22 is determined based on a maximum supply voltage supplied to the RF power amplifier necessary to provide a maximum saturation point of the RF power amplifier during normal operation. In this mode, input signals into the attenuator, from a DSP or the like, ramp upward from zero to a maximum amplitude and back down to zero over a specified time interval. During this interval, a maximum clip level is determined by the clip detector 26 and transmitted to the attenuator control component 24. The attenuator control component 24 evaluates a saturation point of the amplifier based on the maximum clip point determined at the maximum voltage and the instantaneous voltage level of the supply that will be utilized to modulate the reference signal. The attenuator control component 24 then sets the attenuation of the attenuator component 14, so that the saturation point of the power amplifier will not be exceeded at any given input signal and supply voltage. A detailed description of an attenuation setting methodology can be found in U.S. Pat. No. 5,239,693, issued to Gailus et al. on Aug. 24, 1993, for an Amplifier Level-Setting Apparatus, which is hereby incorporated by reference.

During normal operation, input signals (I and Q) are inputted into the attenuator component 14. The envelope R(t) is also a function of the input signals (I and Q). Therefore, as the input signals modulate and vary in amplitude, the envelope R(t) modulates and the modulator 12 varies the supply voltage to the RF power amplifier 22. If the attenuator control component 24 determines that the saturation point will be exceeded at any given input signal, the attenuator control component 24 attenuates the input signal, so that the RF power amplifier 22 operates near but not over the clip point of the RF power amplifier 22 at any given supply voltage. The attenuator control component 24 can also vary the amplitude of the input signal based on variations in the input signal and the supply voltage.

The saturation point of an RF power amplifier can be approximated as the square of the supply voltage divided by two times the load impedance of the amplifier, where the load impedance is generally constant at similar conditions for any given supply voltage. Variations due to manufacturing tolerances and different reactions to environmental conditions may cause the load impedance to vary from amplifier to amplifier. However, differences in saturation points based on changes of supply voltage for any given amplifier are generally consistent. An instantaneous saturation point can be determined as a function of the maximum saturation point at the maximum supply voltage and the instantaneous supply voltage.

For example, if the RF power amplifier saturates $P_{max}$ dbm of power at $V_{max}$, the change of saturation point at an instantaneous voltage $V_{inst}$ can be found by taking the log of the ratio of $V_{max}$ over $V_{inst}$ multiplied by 20. Therefore, if $P_{max}$ is known, the saturation point can be determined for any given supply voltage. Therefore, the attenuator control component 24 can receive the maximum clip point and set the attenuator 14, so that the RF power amplifier 22 operates near, but not over its saturation point for any given amplifier at any given supply voltage, thereby, effectively gaining a high level of performance from the amplifier.

Figure 2:
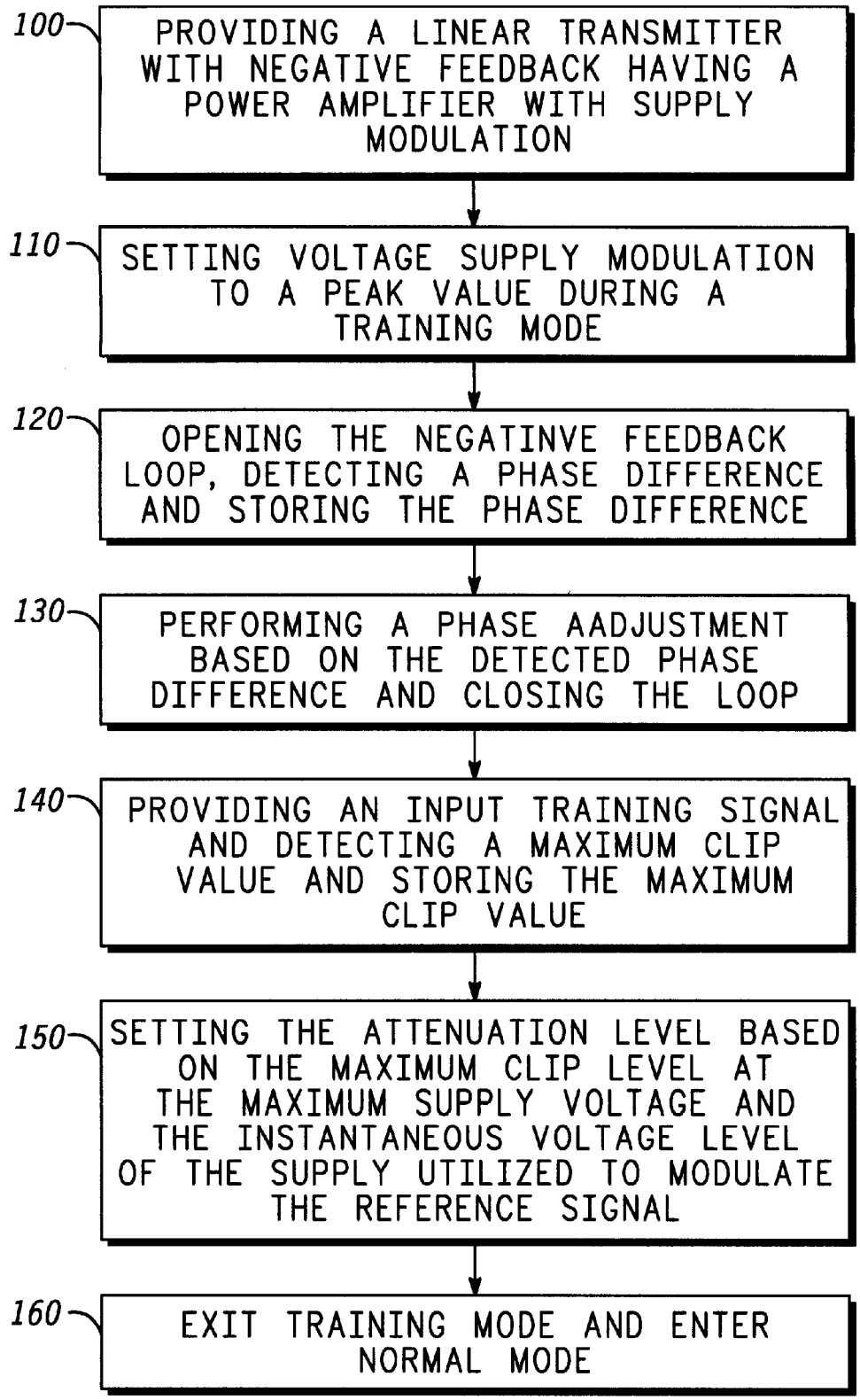
FIG. 2 is a flow diagram illustrating a methodology for training the transmitter system of FIG. 1 in accordance with the present invention.

In view of the structure described above with respect to FIG. 1, a methodology for training a linear transmitter that employs a supply modulation to vary an operating point of a RF power amplifier may be better appreciated with respect to the flow diagram of FIG. 2. While, for purposes of simplicity of explanation, the methodology of FIG. 2 is shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect the present invention.

Referring to FIG. 2, the process begins at step 100 a linear transmitter with negative feedback having a power amplifier with supply modulation. From step 100, the process proceeds to step 110. At step 110, R(t) is set to a peak value during a training mode to provide maximum power supply voltage to the RF power amplifier. The process then advances to step 120 where the negative feedback loop is opened and a phase difference is detected and stored for performing a phase adjustment. The process then proceeds to step 130 where a phase adjustment is employed based on the detected phase difference and the loop is closed. At step 140, a training signal is inputted into the linear amplifier and a maximum clip value is determined by the clip detector 28 and transmitted to the attenuation control component 24. At step 150, an attenuation level is set at the attenuator 14 by the attenuation control component 24 based on an attenuation level determined employing the maximum clip level detected, the maximum supply voltage and the instantaneous voltage level of the supply that will be utilized to modulate the reference signal. At step 160, the training mode is exited and the normal mode is entered until the next training mode.

While certain aspects of the invention have been illustrated and described, it will be clear that the invention is not so limited. Numerous modifications, changes, variations, substitutions and equivalents will occur to those skilled in the art without departing from the spirit and scope of the present invention as defined by the appended claims.

Furthermore, to the extent that the terms "includes" and variations thereof and "having" and variations thereof are used in either the detailed description or the claims, such term is intended to be inclusive in a manner similar to the term "comprising."

What is claimed is:

1. A linear transmitter system having an RF power amplifier, a negative feedback and a power supply modulator to provide supply modulation to the RF power amplifier, the system comprising:
   a clip component adapted to measure a clip point of the RF power amplifier;
   an attenuation control component coupled to the clip component;
   wherein a training signal is inputted into the transmitter while the power supply modulator is set to a maximum voltage wherein the clip component determines the maximum clip point value and transmits the maximum clip point value to the attenuation control component, the attenuation control component receiving the maximum clip point value and determine an attenuation setting for a quadrature component input signal.

2. The system of claim 1, wherein the attenuation control component evaluates an attenuation setting based on the relationship between the maximum clip point at the maximum supply voltage and a supply voltage that will be utilized to modulate the quadrature component input signal during normal operation.

3. The system of claim 1, the attenuation control component being operable to determine if the amplitude of a quadrature component input signal to the linear transmitter system will cause the RF power amplifier to exceed an evaluated saturation point.

4. The system of claim 3, the attenuation control component being further operable to attenuate the quadrature component input signal to a setting that will maintain the RF power amplifier below the evaluated saturation point.

5. The system of claim 1, the negative feedback loop being one of a Cartesian feedback loop, an IF feedback loop and a RF feedback loop.

6. A method of operating a linear transmitter at an optimum operating point, the linear transmitter having a RF power amplifier, a negative feedback and a power supply modulator to provide supply modulation to the RF power amplifier, the method comprising the steps of:
   setting the power supply modulator to a peak voltage;
   performing amplitude training to determine a maximum clip point of the RF power amplifier at the peak voltage;
   inputting a quadrature component signal into the linear transmitter; and
   attenuating an amplitude of the quadrature component signal to avoid exceeding an evaluated saturation point of the RF power amplifier.

7. The method of claim 6, the evaluated saturation point being determined by evaluating the relationship of the maximum clip point at the peak voltage and the instantaneous voltage level of the supply that will be utilized to modulate the quadrature component signal.

8. The method of claim 6, further comprising a step of determining if the amplitude of the quadrature component signal will cause the RF power amplifier to exceed the evaluated saturation point.

9. The method of claim 6, further comprising the steps of opening the negative feedback loop, performing phase training, adjusting the phase difference based on the training and closing the loop after the step of setting the power supply modulator and prior to the step of performing amplitude training.

10. The method of claim 6, the negative feedback loop being one of a Cartesian feedback loop, an IF feedback loop and a RF feedback loop.

* * * * *